(12) United States Patent
Ozawa

(10) Patent No.: US 7,196,579 B2
(45) Date of Patent: Mar. 27, 2007

(54) GAIN-CONTROLLED AMPLIFIER, RECEIVER CIRCUIT AND RADIO COMMUNICATION DEVICE

(75) Inventor: Miho Ozawa, Kanagawa (JP)

(73) Assignee: Sony Corporation (JP)

(*) Notice: Subject to any disclaimer, the term of this patent is extended or adjusted under 35 U.S.C. 154(b) by 213 days.

(21) Appl. No.: 10/522,152

(22) PCT Filed: Aug. 6, 2003

(86) PCT No.: PCT/JP03/10014

§ 371 (c)(1),
(2), (4) Date: Jan. 24, 2005

(87) PCT Pub. No.: WO2004/013961

PCT Pub. Date: Feb. 12, 2004

(65) Prior Publication Data

US 2006/0132235 A1 Jun. 22, 2006

(30) Foreign Application Priority Data

Aug. 6, 2002 (JP) ............................. 2002-228187

(51) Int. Cl.
*H03G 5/16* (2006.01)
(52) U.S. Cl. ......................................... 330/133; 330/98
(58) Field of Classification Search ................ 330/133, 330/98, 310, 311, 150
See application file for complete search history.

(56) References Cited

U.S. PATENT DOCUMENTS

| | | | |
|---|---|---|---|
| 4,870,372 A * | 9/1989 | Suter | .......................... 330/280 |
| 5,471,665 A | 11/1995 | Pace | |
| 5,578,964 A | 11/1996 | Kim et al. | |
| 5,999,052 A | 12/1999 | Tang | |
| 6,456,158 B1 | 9/2002 | Giuroiu | |
| 6,930,549 B2 * | 8/2005 | Kajiwara et al. | ........... 330/254 |
| 6,985,032 B2 * | 1/2006 | Pekonen et al. | ............ 330/149 |
| 2002/0041206 A1 | 4/2002 | Ueno et al. | |

FOREIGN PATENT DOCUMENTS

| | | |
|---|---|---|
| JP | 7-122950 | 5/1995 |
| JP | 7-307624 | 11/1995 |
| JP | 2001-292043 | 4/2000 |
| JP | 2000-216836 | 8/2000 |
| JP | 2000-269755 | 9/2000 |
| JP | 2001-156566 | 6/2001 |
| JP | 2001-292043 | 10/2001 |
| JP | 2002-185259 | 6/2002 |

OTHER PUBLICATIONS

International Search Report dated Nov. 25, 2003.
Supplementary EPO Search Report mailed Apr. 25, 2006.

* cited by examiner

*Primary Examiner*—Henry Choe
(74) *Attorney, Agent, or Firm*—Rader Fishman & Grauer PLLC; Ronald P. Kananen

(57) ABSTRACT

A gain-controlled amplifier capable of dealing with the system for performing the receiving operation continuously, and capable of correcting a change of a DC offset owing to an operation condition such as temperature; a receiver circuit using the gain-controlled amplifier; and a radio communication device installing the receiver circuit. In a gain-controlled amplifier composed of three GCA stages (11)–(13) connected by cascade connection, the center value of an output DC of each GCA stage (11)–(13) is kept to be constant by a common feedback circuit (16)–(18) provided correspondingly to each of the GCA stages (11)–(13), and a DC feedback quantity is made to be changed according to a gain control voltage VG by means of a DC feedback circuit (19) provided between an output side of a last stage of the GCA stages and an input side of a first stage of the GCA stages.

6 Claims, 5 Drawing Sheets

GAIN-CONTROLLED AMPLIFIER, RECEIVER CIRCUIT AND RADIO COMMUNICATION DEVICE

TECHNICAL FIELD

The present invention relates to a gain-controlled amplifier, a receiver circuit and a radio communication device, and more particularly to a gain-controlled amplifier having a function of canceling a DC offset, a receiver circuit adopting the gain-controlled amplifier, and a radio communication device represented by a mobile telephone installing the receiver circuit.

BACKGROUND ART

Reception systems of radio communication systems are divided broadly into two systems, that is, the super-heterodyne system which processes a received high frequency signal after converting it into an intermediate-frequency signal by performing the frequency conversion, and the direct conversion system which processes a received high frequency signal after converting it directly into a base band signal by performing the frequency conversion. In these reception systems, a receiver for the direct conversion system (hereinafter, referred to as a direct conversion receiver) has a smaller number of external components because an intermediate frequency (IF) stage is unnecessary in comparison with that of a receiver of the super-heterodyne system, so that the direct conversion receiver is low in cost. Moreover, because the direct conversion receiver has a relatively simpler circuit configuration, the direct conversion receiver is suitable for a multiband receiver, a multimode receiver and the like. Owing to these reasons, recently the direct conversion receiver has been used for many radio communication systems.

In the direct conversion receiver, when the frequency of a received high frequency signal is denoted by $f_{RF}$ and the frequency of a local signal to be supplied to a mixer (mixing machine) for performing the frequency conversion of the high frequency signal to the base band signal is denoted by $f_{Lo}$, the frequency $f_{RF}$ is equal to the frequency $f_{Lo}$. Consequently, the output signal of the mixer also includes a direct current (DC) component. As a result, the DC component is also input into a gain-controlled amplifier (GCA) provided at the later stage of the mixer for the amplitude adjustment of the base band signal.

In a radio communication device, especially in a mobile telephone, the signal level of a received signal is very weak, for example, about a minus hundred-odd dBm, and, accordingly, it is necessary to amplify the weak signal level to a signal level of about a minus ten-odd dBm by a gain-controlled amplifier. Consequently, the gain-controlled amplifier cannot deal with the problem in a one-stage configuration, and the gain-controlled amplifier is generally configured to be a multi-stage connection that has the maximum gain thereof about 60 dB. When a DC offset at the input stage of the gain-controlled amplifier of the multi-stage connection and DC offsets to be generated at each stage are transferred to the subsequent stages as they are, the DC offsets exceed the dynamic range of the gain-controlled amplifier. Consequently, the cancellation of the DC offsets in the gain-controlled amplifier is a very important issue.

As a circuit for canceling the DC offsets of the gain-controlled amplifier, for example, a circuit for detecting a DC offset voltage when no signals exist to perform a correction on the basis of the detection result is known (see, for example, Japanese Patent Application Publication No. Hei2000-216836). Specifically, the amplification factor of the gain-controlled amplifier is controlled for a predetermined period immediately after turning on the power source thereof to generate a no-input state to a quadrature detector, and the inputs to a demodulator during a period in which the no-input state is lasting are averaged. Thus, the adjustment quantity of the DC offset in the demodulator is determined.

By the above-mentioned prior art technique, for example, in the case of a system in which a no-signal state exists, such as the Global Systems for Mobile Communications (GSM) system for a mobile telephone, it is possible to correct the DC offset every time of no-signal periods by using the no-signal periods. However, in the case of a system in which a receiving operation is continuously performed, such as the Wide-band Code Division Multiple Access (W-CDMA) system, the DC offset cancellation using the no-signal period cannot be performed. Moreover, a change of the DC offset owing to the operation conditions, such as temperature, cannot be corrected.

The present invention was made in view of the above-mentioned problems, and it is an object of the invention to provide again-controlled amplifier capable of dealing with the system for performing the receiving operation continuously, and capable of correcting a change of a DC offset owing to an operation condition such as temperature; a receiver circuit using the gain-controlled amplifier; and a radio communication device installing the receiver circuit.

DISCLOSURE OF THE INVENTION

A gain-controlled amplifier according to the present invention is configured to include: a plurality of differential amplifier stages connected to each other by cascade connection, each of the differential amplifier stages performing gain control by a gain control voltage; a plurality of common feedback circuits provided correspondingly to each of the plurality of differential amplifier stages, each of the common feedback circuits keeping a center value of an output DC of each of the differential amplifier stages constant; and a DC feedback circuit provided between an output side of a last stage of the plurality of differential amplifier stages and an input side of a first stage of the differential amplifier stages, the DC feedback circuit changing a DC feedback quantity according to the gain control voltage. The gain-controlled amplifier is used in a receiver circuit as a gain-controlled amplifier for adjusting the amplitude of a signal obtained by performing the frequency conversion of a received signal. Moreover, the receiver circuit adopting the gain-controlled amplifier is used by being installed in a radio communication device represented by a mobile telephone.

In the gain-controlled amplifier configured as above, the receiver circuit adopting the gain-controlled amplifier, or the radio communication device installing the receiver circuit, feedback control for keeping the center value of the output DC of each of the plurality of differential amplifier stages constant is performed by the plurality of common feedback circuits. Thereby, output DC changes caused by power source voltage changes are canceled. Moreover, the control of the DC feedback quantity is performed by the DC feedback circuit according to the gain control voltage. Thereby, the stability of the system is kept even if the gain of the gain-controlled amplifier is high.

BEST MODE FOR CARRYING OUT THE INVENTION

Figure 1:
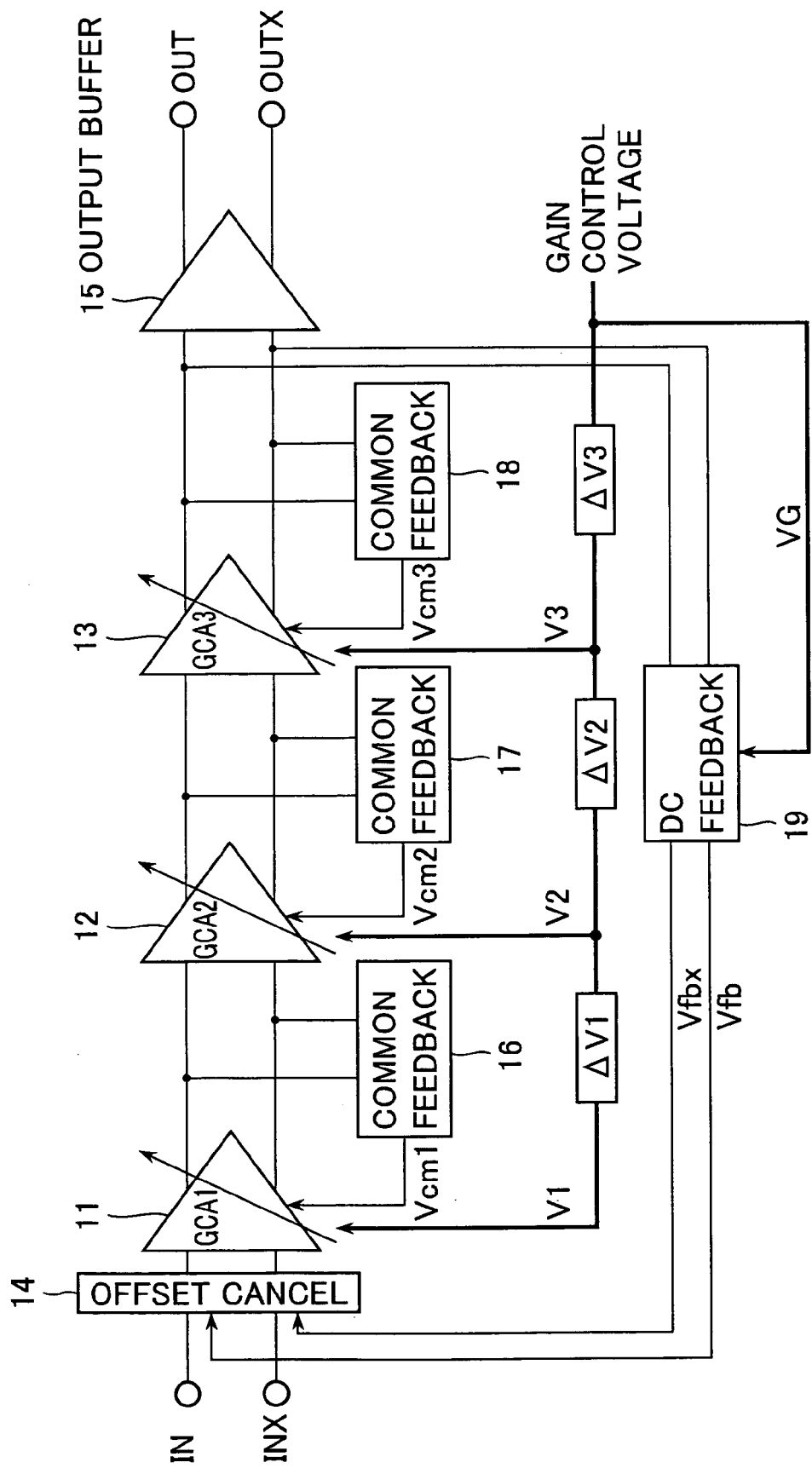
FIG. 1 is a block diagram showing an example of the configuration of a gain-controlled amplifier according to an embodiment of the present invention.

In the following, an embodiment of the present invention is described in detail with reference to the attached drawings. FIG. 1 is a block diagram showing an example of the configuration of a gain-controlled amplifier according to an embodiment of the present invention.

As is apparent from FIG. 1, the gain-controlled amplifier according to the present embodiment has a multi-stage connection, for example, three stages of differential amplifier stages (herein after referred to as GCA stages) 11–13 connected to each other in a cascade connection. The gain-controlled amplifier is configured to include an offset cancel circuit 14 provided at the input stage, an output buffer 15 provided at the output stage, common feedback circuits 16–18 provided correspondingly to each of the GCA stages 11–13, and a DC feedback circuit 19 provided between the output terminal of the GCA stage 13 at the last stage and the offset cancel circuit 14 at the input stage.

Gain control voltages V1–V3 obtained by giving offset voltages ΔV1, ΔV2 and ΔV3 corresponding to each stage to a gain control voltage VG input from the outside are supplied to each of the three stages of the GCA stages 11–13, and each gain of the GCA stages 11–13 is controlled by the gain control voltages V1–V3. The specific configurations and the operation of the GCA stages 11–13 are described in the following.

Figure 2:
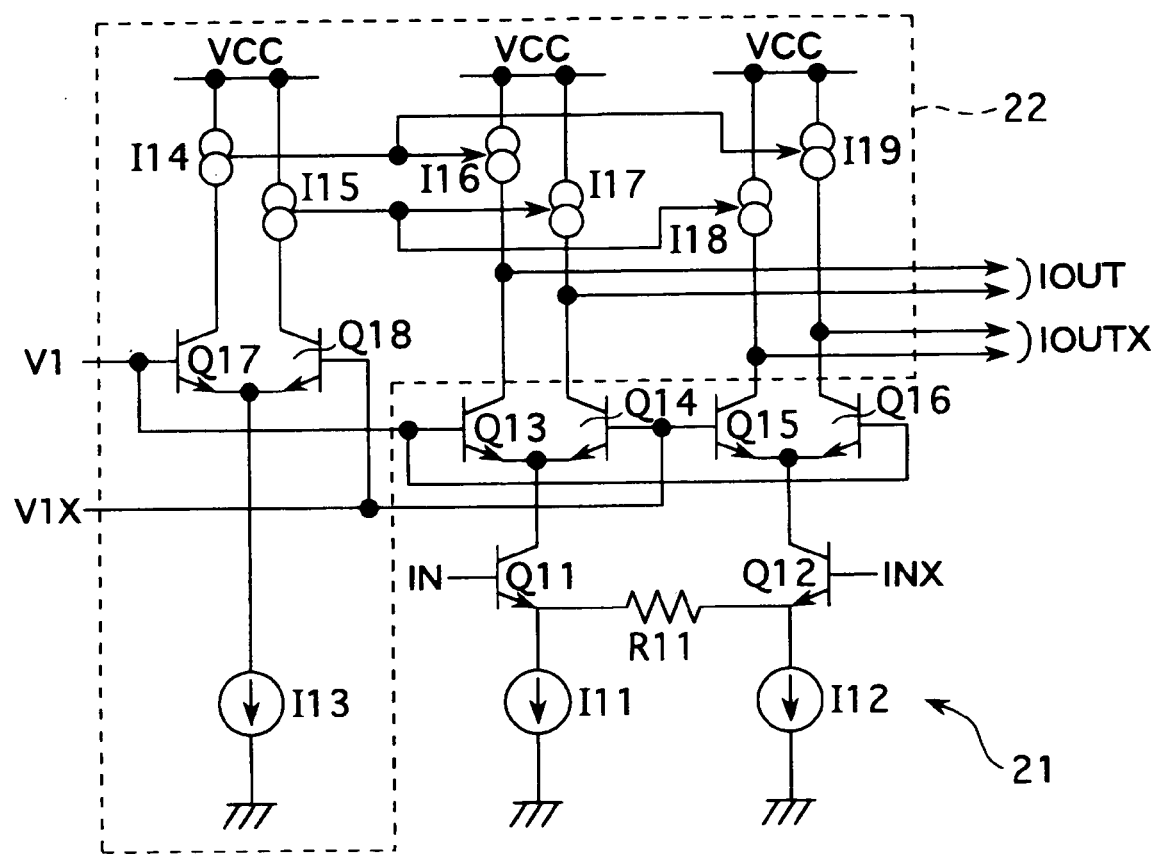
FIG. 2 is a circuit diagram showing an example of the configuration of a GCA stage.

An example of the configurations of the three stages of the GCA stages 11–13 is shown in FIG. 2. Each of the GCA stages 11–13 according to the present example is composed of a differential amplifier using a Gilbert cell, and the like. Because the configurations of the respective GCA stages 11–13 are quite the same, the configuration of the GCA stage 11 at the first stage is herein exemplified and described.

A differential amplifier 21 is configured to include a pair of transistors Q11 and Q12 receiving input signals IN and INX opposite in phase to each other as the base inputs of them; a resistor R11 connected between each emitter of the pair of transistors Q11 and Q12; constant current sources I11 and I12 connected between the emitters of the pair of transistors Q11 and Q12, respectively, and the ground; a pair of transistors Q13 and Q14; the emitters of which are commonly connected to the collector of the transistor Q11; and a pair of transistors Q15 and Q16, the emitters of which are commonly connected to the collector of the transistor Q12.

In the differential amplifier 21, the above-mentioned gain control voltage V1 is supplied to each base of the transistors Q13 and Q16, and a gain control voltage V1X having a phase opposite to that of the gain control voltage V1 is supplied to each base of the transistors Q14 and Q15. Then, the gain of the GCA stage 11 is controlled by the gain control voltages V1 and V1X. At this time, the output DC varies by the gain control. A Gilbert cell circuit 22 performs the operation of canceling the DC change.

The Gilbert cell circuit 22 is configured to include; a pair of transistors Q17 and Q18, which have emitters connected to each other and which severally receive the gain control voltages V1 and V1X as respective base inputs; a constant current source I13 connected between a common connection point of each emitter of the pair of transistors Q17 and Q18 and the ground; constant current sources I14 and I15 connected between the collectors of the pair of transistors Q17 and Q18, respectively, and a power source VCC; constant current sources I16 and I17, which are connected between the collectors of the pair of transistors Q13 and Q14, respectively, and the power source VCC and which configure current mirrors with the constant current sources I14 and I15, respectively; and constant current sources I18 and I19, which are connected between the collectors of the pair of transistors Q15 and Q16, respectively, and the power source VCC and which configure current mirrors with the constant current sources I15 and I14, respectively.

In the Gilbert cell circuit 22, each current value of the constant current sources I14 and I15 (first current sources) changes according to the gain control voltages V1 and V1X, respectively. Accordingly, each current value of the constant current sources I16 and I17 and the constant current sources I18 and I19 (second current sources) constituting the current mirrors with the constant current sources I14 and I15, respectively, changes, and then DC offset canceling currents are controlled. As a result, the changes of the output DC owing to the gain control of the differential amplifier 21 can be canceled independently of the power source voltage VCC.

Again, in FIG. 1, each of the common feedback circuits 16–18 performs the operation of keeping the center value of the output DC of each of the GCA stages 11–13 constant. The specific configurations and the operation of the common feedback circuits 16–18 are described in the following. Because each configuration of the common feedback circuits 16–18 is quite the same, the configuration of the common feedback circuit 16 is herein exemplified and described.

Figure 3:
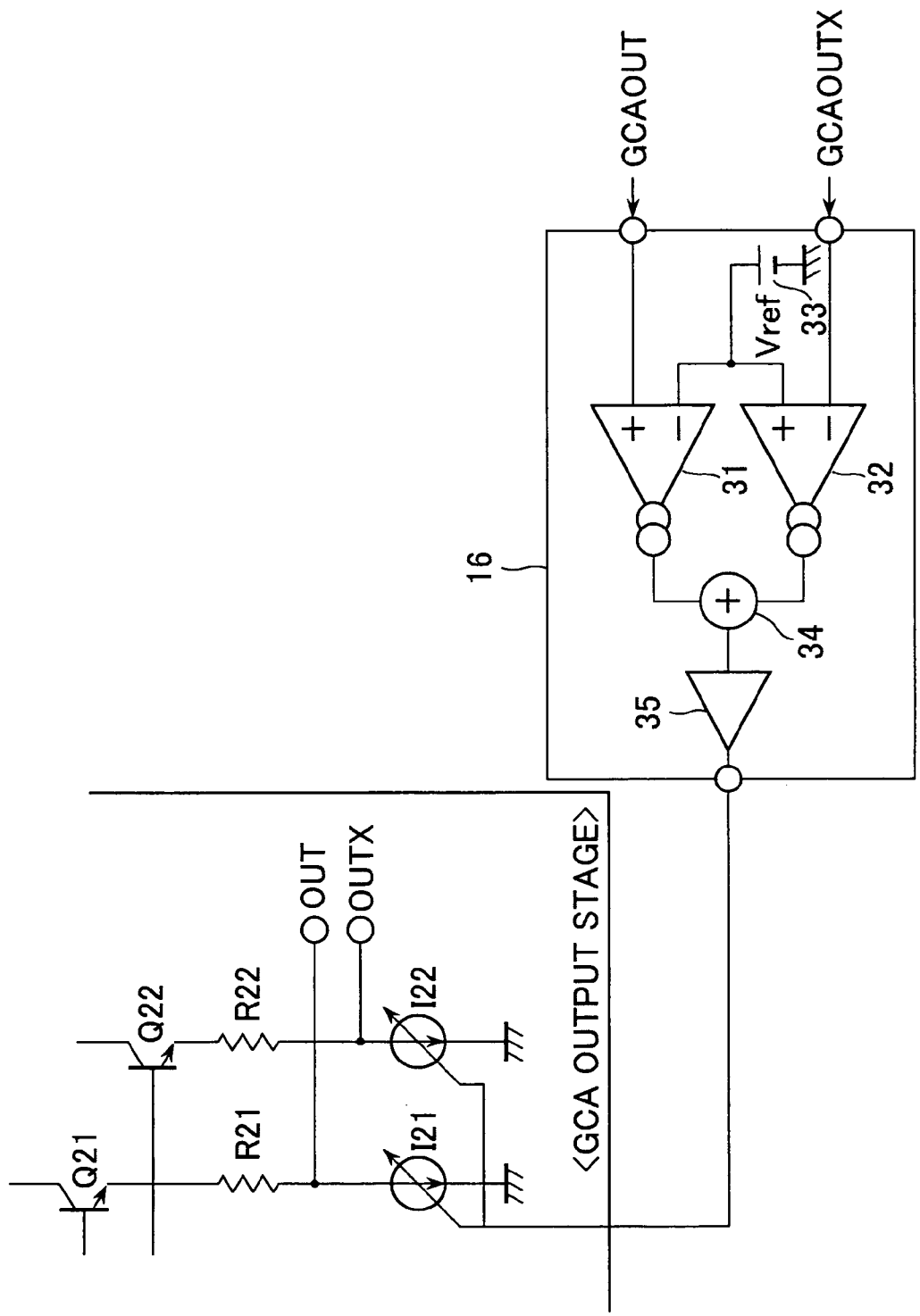
FIG. 3 is a block diagram showing an example of the configuration of a common feedback circuit.

An example of the configuration of the common feedback circuit 16 is shown in FIG. 3. As is apparent from the figure, the common feedback circuit 16 is configured to include two difference circuits 31 and 32, a voltage reference 33, an adder 34 and a buffer amplifier 35. As each of the difference circuits 31 and 32, for example, a differential amplifier is used. The difference circuit 31 receives a positive phase output GCAOUT of the GCA stage 11 as a noninverting (+) input and a reference voltage Vref supplied from the voltage reference 33 as an inverting (–) input and outputs the difference of the positive phase output GCAOUT to the reference voltage Vref.

The difference circuit 32 receives an opposite phase output GCAOUTX of the GCA stage 11 as an inverting input and the reference voltage Vref as a noninverting input and outputs the difference of the opposite phase output GCAOUTX to the reference voltage Vref. Each difference output of the difference circuits 31 and 32 is added to each other by the adder 34, and it is supplied to the GCA stage 11 through the buffer amplifier 35 as a common control voltage Vcm1.

FIG. 3 shows only the configuration of the output stage portion of the GCA stage 11. The output stage portion is configured to include, for example, emitter follower transistors Q21 and Q22, resistors R21 and R22 each having an end connected to each emitter of the transistors Q21 and Q22, respectively, and bias current sources I21 and I22 connected between the other ends of the resistors R21 and R22, respectively, and the ground.

In the output stage portion of the GCA stage 11, each current value of the bias current sources I21 and I22 is controlled by the common control voltage Vcm1 supplied from the common feedback circuit 16, namely a signal obtained by the addition of the difference of the positive phase output GCAOUT to the reference voltage Vref and the difference of the opposite phase output GCAOUTX to the reference voltage Vref, and whereby the center value of the output DC is kept constant. By the feedback control by means of the common feedback circuit 16, the output DC changes caused by the changes of the power source voltage VCC can be canceled.

Moreover, not only the changes of the power source voltage VCC but also the DC components generated by the GCA stage 11 can be canceled. That is to say, by receiving the current outputs of the GCA stage 11, which is constituted by the differential amplifier adopting the Gilbert cell shown in FIG. 2, by the bias current sources I21 and I22 independent of the power supply through the resistors R21 and R22, respectively, the DC components generated in the GCA stage 11 can be canceled.

Figure 4:
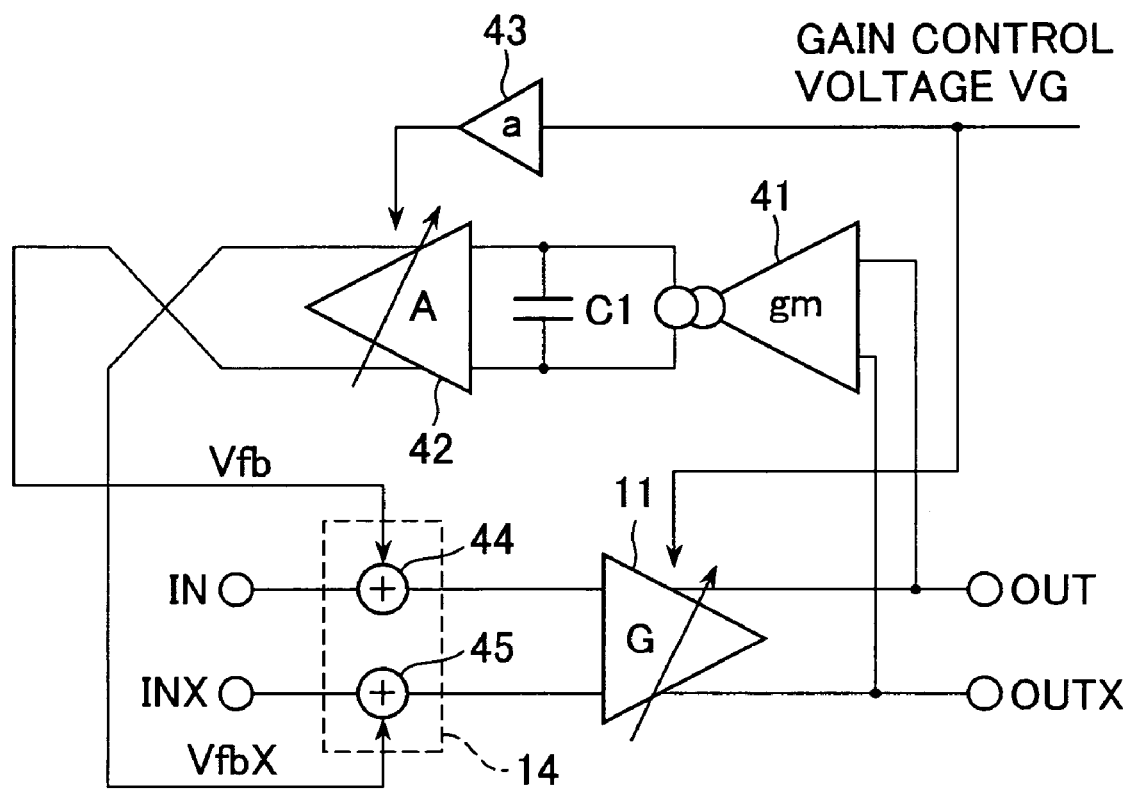
FIG. 4 is a block diagram showing an example of the configuration of a DC feedback circuit.

Again, in FIG. 1, the DC feedback circuit 19 is provided between the output side of the GCA stage 13 at the last stage and the offset cancel circuit 14 connected on the input side of the GCA stage 11 at the first stage and performs the operation of changing a DC feedback quantity on the basis of the gain control voltage VG supplied from the outside. An example of the configuration of the DC feedback circuit 19 is shown in FIG. 4. The DC feedback circuit 19 of the present example is configured to include a detection circuit for detecting output voltages OUT and OUTX of the GCA stage 13 at the last stage, for example, a conductance circuit (hereinafter referred to as a gm amplifier) 41, a DC cutting capacitor C1, a variable gain amplifier (VGA) 42 and a coefficient circuit 43.

The gm amplifier 41 is a voltage-current conversion circuit. The gm amplifier 41 detects the output voltages OUT and OUTX of the GCA stage 13 at the last stage to convert the detected voltages to currents. The capacitor C1 is connected between the input terminals of the variable gain amplifier 42 to perform the DC cutting of the outputs of the gm amplifier 41. The variable gain amplifier 42 amplifies the DC cut outputs of the gm amplifier 41 and supplies the amplified outputs to the offset cancel circuit 14 at the input stage as feedback voltages Vfb and VfbX. The coefficient circuit 43 multiplies the gain control voltage VG supplied from the outside by a coefficient a and supplies the multiplied gain control voltage VG to the variable gain amplifier 42 as its gain control voltage a*VG.

Incidentally, the offset cancel circuit 14 provided on the input side of the GCA 11 at the first stage is composed of two adders 44 and 45. The adder 44 adds the positive phase feedback voltage Vfb to the input signal IN, and the adder 45 adds the opposite phase feedback voltage VfbX to the input signal INX. Thus, the offset cancel circuit 14 is configured to perform offset cancel.

The case where the gain control of the variable gain amplifier 42 in accordance with the gain control voltage a*VG is not performed in the DC feedback circuit 19 configured as above is considered. When it is supposed that the gain of the gain-controlled amplifier of the present embodiment is denoted by a letter G, the conductance of the gm amplifier 41 is denoted by a letter gm, the gain of the variable gain amplifier 42 is denoted by a letter A, and the capacity of the capacitor C1 is denoted by a letter C, the cutoff frequency ωo of the DC feedback circuit 19 can be expressed as follows:

$$\omega o = (G * gm * A)/C \quad (1).$$

As apparent from the formula (1), the cutoff frequency ωo of the DC feedback circuit 19 is in proportion to the gain G of the gain-controlled amplifier.

A radio terminal represented by a mobile telephone generally has a wide gain-controlled range in the order of several tens dB. Consequently, the cutoff frequency ωo of the DC feedback circuit 19 changes within a range from one at the minimum gain to one at the maximum gain, which is tens of times to hundreds of times as large as the former one. When an external large capacity is used as the capacitor C1, the cutoff frequency ωo can be sufficiently lowered.

However, when it is desired that the capacitor C1 having a small capacitance for integrating as an integrated circuit (IC), the cutoff frequency ωo at the time of a high gain would become high. Moreover, as described above, because the gain-controlled amplifier of the radio terminal has a high gain, the gain of the feedback system thereof becomes high at the time of the high gain, and it is expected that the system would become unstable.

Accordingly, the gain-controlled amplifier of the present embodiment uses the gain control voltage VG supplied from the outside, as shown in FIG. 4, and adopts the configuration of changing the gain A of the variable gain amplifier 42, namely, the feedback gain of the DC feedback circuit 19. In this case, the cutoff frequency ωo' of the DC feedback circuit 19 is expressed as follows:

$$\omega o' = G * gm * A * a * VG \quad (2).$$

Hereupon, the gain G of the gain-controlled amplifier is in proportion to the gain control voltage VG.

By the adoption of the configuration, the change range of the cutoff frequency ωo' of the DC feedback circuit 19 can be narrowed since the gain G of the gain-controlled amplifier is controlled by the gain control voltage VG. In other words, even if the gain G of the gain-controlled amplifier changes significantly, the change of the cutoff frequency ωo' of the DC feedback circuit 19 is small. That is to say, the cutoff frequency ωo' at the time of a high gain can be lowered. Consequently, because the DC feedback can be performed by using a small capacity, the integration to an IC is made easy. On the other hand, in the case of a low gain, because the cutoff frequency ωo' does not become too low, the response speed of the system does not become slow even in the case of a low gain.

In the gain-controlled amplifier of the present embodiment configured as above, the DC feedback by the DC feedback circuit 19 is always effective in the state of operation. However, even if the DC feedback is always effective, the stable system can be obtained by the control of the output DC's of the GCA stages 11–13, the cancellation of output DC changes caused by power source voltage changes by the common feedback circuits 16–18, and the control of the DC feedback quantity by the DC feedback circuit 19. This means that this is effective for a system such as the W-CDMA system of a mobile telephone in which signals are received without any intermissions, namely, a system which continuously performs the receiving operation.

Moreover, by the operation of the common feedback circuits 16–18, not only the power source voltage changes, but also the DC components generated in each of the GCA stages 11–13 can be canceled, and consequently the correction of the changes of the DC offset caused by the operation conditions, such as temperature, also can be performed.

APPLICATION EXAMPLE

Figure 5:
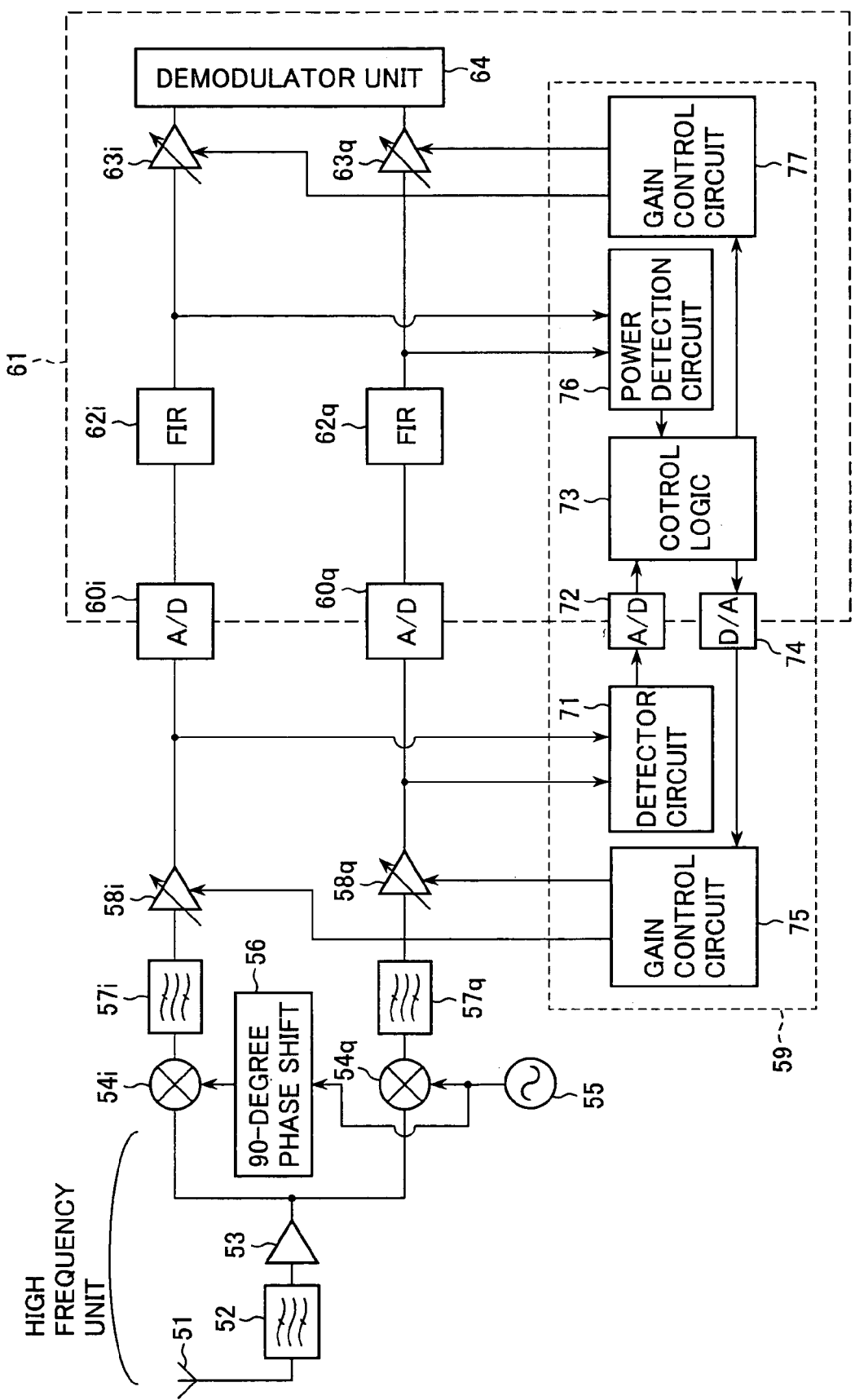
FIG. 5 is a block diagram showing an example of the configuration of the principal part of a direct conversion receiver.

The gain-controlled amplifier of the present embodiment described above can be suitably used in a receiver circuit of a direct conversion receiver used for a radio communication device, such as a mobile telephone. FIG. 5 is a block diagram showing an example of the configuration of the principal part of the direct conversion receiver.

In FIG. 5, a high frequency signal received by an antenna 51 is supplied to mixers 54i and 54q as an input one side of each mixer through a band-pass filter 52 and a low noise amplifier 53. A local signal output from a local oscillator 55 is supplied to the mixer 54i as the other side input after the phase of the local signal shifted by 90 degrees by a 90-degree phase shifter 56. The local signal output from the local oscillator 55 is directly supplied to the mixer 54q as the other side input thereof. The frequency $f_{RF}$ of the local signal and the frequency $f_{Lo}$ of the high frequency signal are set to be the same frequency.

The mixer 54i mixes the local signal having a phase difference of 90° from that of the input high frequency signal to be input with the input high frequency signal and obtains an in-phase component I (hereinafter referred to as an I signal) in a base band (0 Hz). The mixer 54q mixes the local signal having the phase difference 0° from that of the input high frequency signal to be input with the input high frequency signal and obtains a quadrature component Q (hereinafter referred to as a Q signal) in the base band. The I signal and the Q signal are supplied to analog low-pass filters (hereinafter referred to as analog LPFs) 57i and 57q.

The analog LPFs 57i and 57q severally have a role of extracting only a signal in a desired frequency band (desired channel) from a received signal. After the amplitudes of the signals in the desired frequency band extracted by the analog LPFs 57i and 57q have been adjusted by the analog gain-controlled amplifiers 58i and 58q, respectively, the amplitude-adjusted signals are directly supplied to an automatic gain control (AGC) unit 59, are converted to digital signals by analog to digital (A/D) converters 60i and 60q supplied to a digital unit 61.

The digital unit 61 is configured to include digital low pass filters serially connected after the A/D converters 60i and 60q, such as finite impulse response (FIR) filters 62i and 62q and digital gain-controlled amplifiers 63i and 63q, and a demodulator unit 64 for demodulating received digital signals. Then, cut-off characteristics necessary for channel selection are obtained by combining each of the analog LPFs 57i and 57q and the FIR filters 62i and 62q, respectively.

When an interfering signal exists in a channel adjacent to a desired receiving channel, because the cut-off characteristics of the analog LPFs 57i and 57q are insufficient, the signal of the adjacent channel remains in the input signals of the A/D converters 60i and 60q. Accordingly, the signal of the adjacent channel is attenuated up to a desired level by the FIR filters 62i and 62q. Then, in order that the input signal levels of the demodulator unit 64 are optimal and stable, gain control by the digital gain-controlled amplifiers 63i and 63q is performed in addition to gain control by the analog gain-controlled amplifiers 58i and 58q.

Each gain control by the analog gain-controlled amplifiers 58i and 58q and by the digital gain-controlled amplifiers 63i and 63q is performed by the AGC unit 59. The AGC unit 59 is composed of an analog AGC loop for performing the gain control of the analog gain-controlled amplifiers 58i and 58q and a digital AGC loop for performing the gain control of the digital gain-controlled amplifiers 63i and 63q.

The analog AGC loop is formed of a detector circuit 71 for performing the level detection of the output signals of the analog gain-controlled amplifiers 58i and 58q, an A/D converter 72 for converting the detected levels to a digital signal, a control logic circuit 73 for setting a proper gain value on the basis of the output signal of the A/D converter 72, a digital/analog (D/A) converter 74 for converting the gain data output from the control logic circuit 73 to an analog signal, and a gain control circuit 75 for controlling the gains of the analog gain-controlled amplifiers 58i and 58q in conformity with the gain control voltage VG according to the output signal of the D/A converter 74.

The analog AGC loop is configured to perform gain control by feedback control. The digital AGC loop is formed of a power detection circuit 76 for detecting the signal strength of the output signals of the FIR filters 62i and 62q, namely, the signal strength of the input signals of the digital gain-controlled amplifiers 63i and 63q, a control logic circuit 73 for setting a proper gain value on the basis of the detection values of the power detection circuit 76, and a gain control circuit 77 for controlling the gains of the digital gain-controlled amplifiers 63i and 63q on the basis of the gain data output from the control logic circuit 73. The digital AGC loop is configured to perform the gain control by feed forward control.

In the direct conversion receiver configured as above, the gain-controlled amplifier according to the above-mentioned embodiment is used as each of the analog gain-controlled amplifiers 58i and 58q in the receiver circuit for the base band. Because in the direct conversion receiver, as described above, the frequency $f_{RF}$ is equal to the frequency $f_{Lo}$, the output signals of the mixers 54i and 54q include DC components, and the DC components are also input into the gain-controlled amplifiers 58i and 58q at the subsequent stage of the mixers 54i and 54q. Consequently, it is necessary to cancel the DC offsets.

Accordingly, by adopting the gain-controlled amplifier according to the above-mentioned embodiment as each of the analog gain-controlled amplifiers 58i and 58q, constant output DC's can be obtained without being influenced by operation conditions, such as power source voltage changes and temperature, and independently of the gain control voltage VG. Moreover, the use of the gain-controlled amplifier is effective for a system for receiving signals without any intermissions, namely a system for continuously performing the receiving operation, such as the W-CDMA system of a mobile telephone.

Incidentally, in the present application example, the case where the present invention is applied to a direct conversion receiver is exemplified described. However, the application of the present invention is not limited to the application example, and the present invention is similarly applicable to a receiver of a low intermediate frequency (IF) system for processing a received high frequency signal after performing the frequency conversion of the received high frequency signal to a low intermediate frequency.

As described above, according to the present invention, in a gain-controlled amplifier composed of a plurality of differential amplifier stages connected to each other by the cascade connection, the center value of the output DC of each differential amplifier stage is kept constant by a common feedback circuit provided correspondingly to each of the plurality of differential amplifier stages. Moreover, by changing a DC feedback quantity according to a gain control voltage VG by means of a DC feedback circuit provided between the output side of the last stage of the plurality of differential amplifier stages and the input side of the first stage of the differential amplifier stages, a constant output DC can be obtained without being influenced by operation conditions, such as power source voltage changes and temperature, and independently of the gain control voltage. Moreover, it is also possible to deal with a system for continuously performing the receiving operation.

The invention claimed is:

1. A gain-controlled amplifier, characterized by comprising:
   a plurality of differential amplifier stages connected to each other by cascade connection, each of said differential amplifier stages performing gain control by a gain control voltage;
   a plurality of common feedback circuits provided correspondingly to each of said plurality of differential amplifier stages, each of said common feedback circuits keeping a center value of an output DC of each of said differential amplifier stages to be constant; and
   a DC feedback circuit provided between an output side of a last stage of said plurality of differential amplifier stages and an input side of a first stage of said differential amplifier stages, said DC feedback circuit changing a DC feedback quantity according to said gain control voltage.

2. The gain-controlled amplifier according to claim 1, characterized in that each of said plurality of differential amplifier stages comprises:
   a differential amplifier in which a gain is changed according to said gain control voltage;
   a first current source in which a current value is changed according to said gain control voltage; and
   a Gilbert cell circuit provided between a load side of said differential amplifier and a power source, said Gilbert cell including a second current source constituting a current mirror with said first current source.

3. The gain-controlled amplifier according to claim 1, characterized in that each of said plurality of common feedback circuits comprises:
   a first difference circuit for outputting a difference of each positive phase output of said plurality of differential amplifier stages to a predetermined reference voltage;
   a second difference circuit for outputting a difference of each opposite phase output of said plurality of differential amplifier stages to said predetermined reference voltage; and
   an adder for adding each difference output of said first difference circuit and said second difference circuit;
   wherein a current value of a current source constituting each stage of said plurality of difference amplifier stages. is controlled by an added output of said adder.

4. The gain-controlled amplifier according to claim 1, characterized in that said DC feedback circuit comprises:
   a detector circuit for detecting an output voltage at a last stage of said plurality of differential amplifier stages; and
   a variable gain amplifier for amplifying an output of said detector circuit by a gain in accordance with said gain control voltage;
   wherein an output of said variable gain amplifier is added to an input of a first stage of said plurality of differential amplifier stages.

5. A receiver circuit, characterized by comprising a gain-controlled amplifier for adjusting an amplitude of a signal obtained by performing a frequency conversion of a received signal, wherein said gain-controlled amplifier has:
   a plurality of differential amplifier stages connected to each other by cascade connection, each of said differential amplifier stages performing gain control by a gain control voltage;
   a plurality of common feedback circuits provided correspondingly to each of said plurality of differential amplifier stages, each of said common feedback circuits keeping a center value of an output DC of each of the differential amplifier stages to be constant; and
   a DC feedback circuit provided between an output side of a last stage of said plurality of differential amplifier stages and an input side of a first stage of said differential amplifier stages, the DC feedback circuit changing a DC feedback quantity according to said gain control voltage.

6. A radio communication device, characterized by comprising:
   an antenna;
   frequency converting means for performing a frequency conversion of a high frequency signal received by said antenna; and
   a gain-controlled amplifier for adjusting an amplitude of a signal obtained by performing the frequency conversion of a received signal;
   wherein said gain-controlled amplifier has:
   a plurality of differential amplifier stages connected to each other by cascade connection, each of said differential amplifier stages performing gain control by a gain control voltage;
   a plurality of common feedback circuits provided correspondingly to each of said plurality of differential amplifier stages, each of said common feedback circuits keeping a center value of an output DC of each of said differential amplifier stages to be constant; and
   a DC feedback circuit provided between an output side of a last stage of said plurality of differential amplifier stages and an input side of a first stage of said differential amplifier stages, said DC feedback circuit changing a DC feedback quantity according to said gain control voltage.

* * * * *